United States Patent
Suzuki et al.

(10) Patent No.: US 6,556,419 B2
(45) Date of Patent: Apr. 29, 2003

(54) ELECTRONIC COMPONENT AND METHOD FOR PRODUCING SAME

(75) Inventors: Hideyuki Suzuki, Kasugai (JP); Masahiro Abe, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/059,468

(22) Filed: Jan. 29, 2002

(65) Prior Publication Data

US 2002/0105775 A1 Aug. 8, 2002

(30) Foreign Application Priority Data

Feb. 5, 2001 (JP) .................................. 2001-028705

(51) Int. Cl.[7] .............................................. H01G 4/005
(52) U.S. Cl. ......................................... 361/303; 361/305
(58) Field of Search ................................. 361/303, 305, 361/306.3, 307, 308.1, 309, 311–313, 321.2

(56) References Cited

U.S. PATENT DOCUMENTS 4,752,858 A * 6/1988 Yokotani et al. ......... 361/321.4

FOREIGN PATENT DOCUMENTS

| JP | 07066001 | * | 3/1995 |
| JP | 08007644 | | 1/1996 |

* cited by examiner

Primary Examiner—Anthony Dinkins
(74) Attorney, Agent, or Firm—Burr & Brown (57) ABSTRACT

Ag powder particles each having a surface coated with alumina form a material. A conductor paste is prepared from the material. The conductor paste is printed on a dielectric layer by means of screen printing, for example. Accordingly, an electrode pattern of the conductor paste is formed. In this procedure, the BET specific surface area of the Ag powder particle is 0.05 to 2 $m^2/g$. The coating amount of alumina is about 0.01 to 2% as converted into a value of oxide with respect to the Ag powder particles.

6 Claims, 8 Drawing Sheets

ELECTRONIC COMPONENT AND METHOD FOR PRODUCING SAME

This application claims the benefit of Japanese Application No. 2001-028705, filed Feb. 5, 2001, the entirety of which is incorporated herein by reference.

BACKGROUND OF THE INVENTION

1. Field of the Invention

The present invention relates to an electronic component and a method for producing the same. The present invention is applicable to a dielectric resonator of a stacked type to be used for a resonance circuit, for example. The stacked type dielectric resonator is preferably used for a microwave band of several hundred MHz to several GHz.

2. Description of the Related Art

Recently, a noble metal powder which is used to prevent any structural defects caused in an electronic component and a heater has been suggested (see, for example, Japanese Laid-Open Patent Publication No. 8-7644). The noble metal powder is firstly prepared as a conductor paste. Then, the conductor paste is formed on a substrate (for example, ceramic green sheets). The substrate on which the conductor paste has been formed is sintered. Accordingly, an electrode is made from the conductor paste. That is, an electronic component or a heater in which the electrode is formed on the substrate can be made.

The surface of the noble metal powder is coated with a compound of metal and organic acid (metal salt of organic acid) and then heated in an inert atmosphere. When the conductor paste is prepared using the noble metal powder, the material for the noble metal powder and the material for the organic acid are selected and weighed out so that the percentage of firing shrinkage of the conductor paste is approximately the same as the percentage of faring shrinkage of the substrate (for example, ceramic green sheets).

When the conductor paste is formed on the substrate, and the conductor paste is thereafter sintered to produce an electronic component or a heater, then it is possible to avoid such a phenomenon that the electrode of the conductor paste is peeled off from the substrate or the electrode is evaporated, because the percentage of firing shrinkage of the conductor paste is approximately the same as that of the substrate. Thus, it is possible to prevent any structural defects which would otherwise occur in the electronic component or the heater.

When the conductor paste is prepared, the material for the noble metal powder and the material for the organic acid are selected and weighed out so that the percentage of firing shrinkage of the conductor paste is approximately the same as the percentage of firing shrinkage of the substrate. However, since the selection and the weighing-out operation for the materials as described above are extremely troublesome, the number of manufacturing steps may be increased.

Further, in conventional methods, the specific surface area of the noble metal powder is not considered at all. No consideration is made for the relationships among the specific surface area of the noble metal powder, the coating amount of the metal salt of organic acid, and the electric resistance value.

In other works, in order to prevent the occurrence of the structural defects, it is sometimes necessary to increase the coating amount of the metal salt of organic acid depending on the value of the specific surface area of the noble metal powder. In such a situation, the electric resistance value may be increased, and device characteristics and electric characteristics of the electronic component may be deteriorated.

SUMMARY OF THE INVENTION

An object of the present invention is to provide an electronic component and a method for producing the same which make it possible to reduce the occurrence of structural defects during and after the sintering of a dielectric substrate when an electrode is formed in the dielectric substrate.

An electronic component according to the present invention has a dielectric substrate and one or more electrodes. The dielectric substrate is formed by stacking a plurality of dielectric layers and sintering the plurality of stacked dielectric layers. The electrodes are formed of a paste, the paste contains metal powder particles, and each of the metal powder particles is coated with an inorganic oxide.

A method for producing an electronic component according to the present invention is applied to an electronic component having a dielectric substrate and one or more electrodes. That is, at first a plurality of dielectric layers is prepared. A paste is formed on one or more of the dielectric layers to form the electrodes of the paste. Subsequently, the plurality of dielectric layers are stacked and sintered. The paste contains metal powder particles, and each of the metal powder particles is coated with an inorganic oxide.

Usually, when the electrode is formed of a metal film, the shrinkage of the metal film is advanced faster than the shrinkage of the dielectric layer during the sintering which will be performed later. The reason for this is that the percentage of firing shrinkage of the metal film is greatly different from that of the dielectric layer. Therefore, delamination may be generated at a portion where the metal film has been formed. Residual stress may be also generated in the dielectric layer after the sintering. As a result, some structural defects may occur in the electronic component.

However, in the present invention, the electrode is formed by using the paste containing the material in which the metal powder particles are coated with the inorganic oxide. Therefore, no delamination is generated during the sintering, and no cracks are generated by the residual stress. That is, the percentage of firing shrinkage of the electrode is close to the percentage of firing shrinkage of the dielectric layer because of the coating of the inorganic oxide.

In the present invention, it is preferable that Ag is used for the metal powder particles. It is preferable that the BET specific surface area of the metal powder particle is 0.05 to 2 $m^2/g$. If the BET specific surface area is less than 0.05 $m^2/g$, the metal particles may become too large and pores may be formed in the electrode during the sintering. If the BET specific surface area is larger than 2 $m^2/g$, it is necessary to increase the coating amount of the inorganic oxide in order to avoid the structural defects in the electronic component. As a result, the electric resistance of the electrode may be increased and the electric characteristics and the device characteristics may be deteriorated when the electronic component is completed. Therefore, it is preferable that the BET specific surface area of the metal powder particle is 0.05 to 2 $m^2/g$.

According to the present invention, when the electronic component in which the electrodes are formed in the dielectric layer is produced, it is possible to reduce the occurrence of the structural defects in the electronic component during and after the sintering of the dielectric layer.

In the present invention, it is preferable that Ag is used for the metal powder particles. It is preferable that the BET specific surface area of the metal powder particle is 0.05 to 2 m²/g. If the BET specific surface area is less than 0.05 m²/g, the metal particles may become too large and pores may be formed in the electrode during the sintering. If the BET specific surface area is larger than 2 m²/g, it is necessary to increase the coating amount of the inorganic oxide in order to avoid the structural defects in the electronic component. As a result, the electric resistance as the electrode may be increased and the electric characteristics and the device characteristics may be deteriorated when the electronic component is completed. Therefore, it is preferable that the BET specific surface area of the metal powder particle is 0.05 to 2 m²/g.

It is preferable that the inorganic oxide is alumina. It is preferable that the metal powder particle is coated with the inorganic oxide in an amount of approximately 0.01 to 2% as converted into a value of oxide with respect to the metal powder particle.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

An illustrative embodiment will be explained below with reference to FIGS. 1 to 8, in which the present invention is applied to a stacked type dielectric filter.

Figure 1:
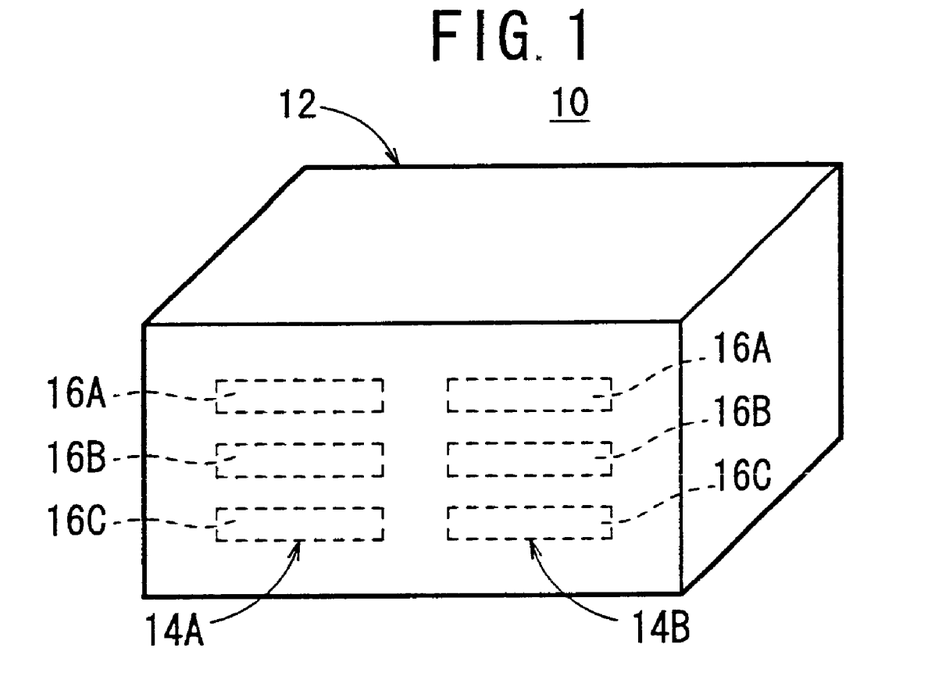
FIG. 1 is a perspective view illustrating a stacked type dielectric filter in an embodiment according to the present invention.

As shown in FIG. 1, the stacked type dielectric filter 10 in the embodiment according to the present invention has a dielectric substrate 12 constructed by stacking a plurality of dielectric layers. Two pairs of resonators (first and second resonators 14A, 14B) are formed in the dielectric substrate 12. The resonator 14A comprises three stacked resonance electrodes 16A to 16C, and the resonator 14B comprises another three stacked resonance electrodes 16A to 16C. The dielectric layers are interposed between the resonance electrodes 16A, 16B and between the resonance electrodes 16B, 16C, respectively.

Figure 2:
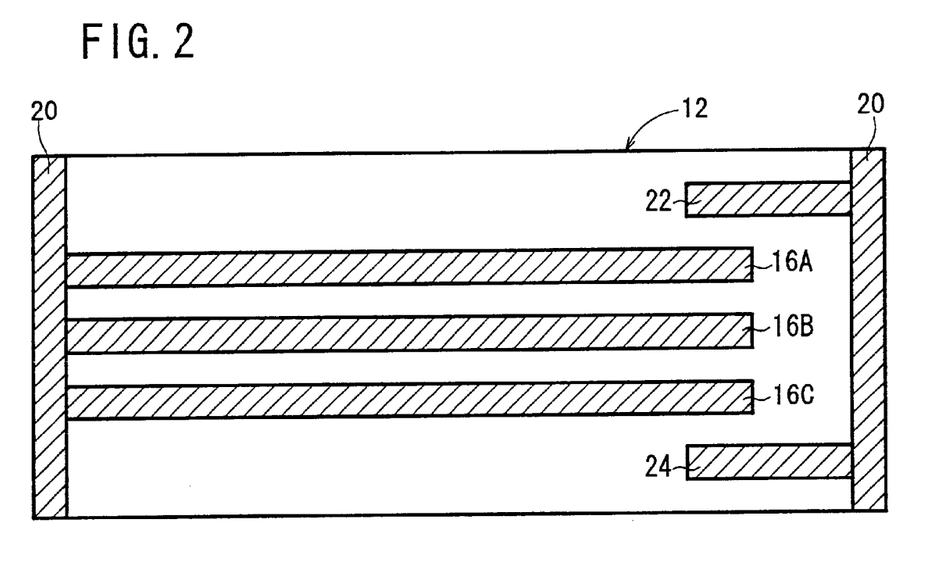
FIG. 2 is a longitudinal sectional view in which the stacked type dielectric filter is cut along a tong side of a resonance electrode when the ¼ wavelength resonance electrode is used.

As shown in FIG. 2, when the resonance electrodes 16A to 16C are ¼ wavelength resonance electrodes, a ground electrode 20 is formed on a side surface to which the resonance electrodes 16A to 16C are exposed. In other words, in the example shown in FIG. 2, first ends of the respective resonance electrodes 16A to 16C are short-circuited with the ground electrode 20. In this arrangement, open ends of the respective resonance electrodes 16A to 16C are capacitively coupled to the ground electrode 20 by the inner layer ground electrodes 22, 24. Accordingly, the electrical length of each of the resonance electrodes 16A to 16C can be shortened.

Figure 3:
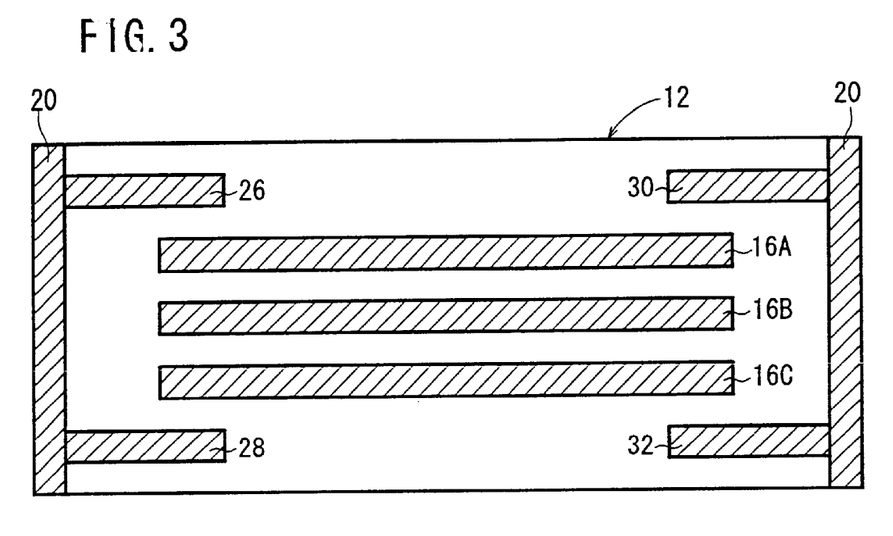
FIG. 3 is a longitudinal sectional view in which the stacked type dielectric filter is cut along a long of side of a resonance electrode when the ½ wavelength resonance electrode is used.

As shown in FIG. 3, when the resonance electrodes 16A to 16C are ½ wavelength resonance electrodes, the respective resonance electrodes 16A to 16C are not exposed from the side surface of the dielectric substrate 12. Both ends of the respective resonance electrodes 16A to 16C are capacitively coupled to ground electrodes 20 by the inner layer ground electrodes 26, 28, 30, 32 respectively.

In the stacked type dielectric filter 10 in this embodiment, at least the resonance electrodes 16A to 16C are constructed by sintering a conductor paste formed in the dielectric substrate 12. The conductor paste contains a material in which metal powder particles are coated with inorganic oxide.

Figure 4:
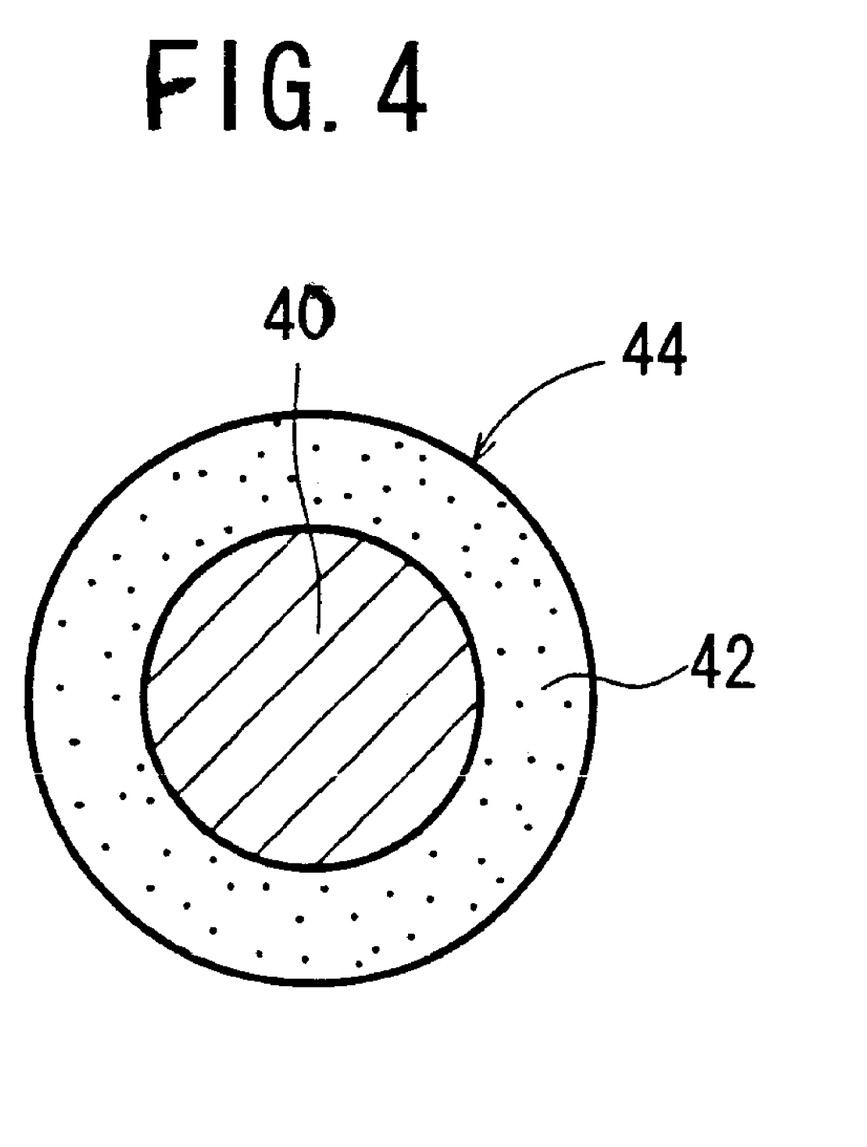
FIG. 4 is a sectional view schematically illustrating a material obtained by coating a surface of Ag powder particles with alumina.
Figure 5:
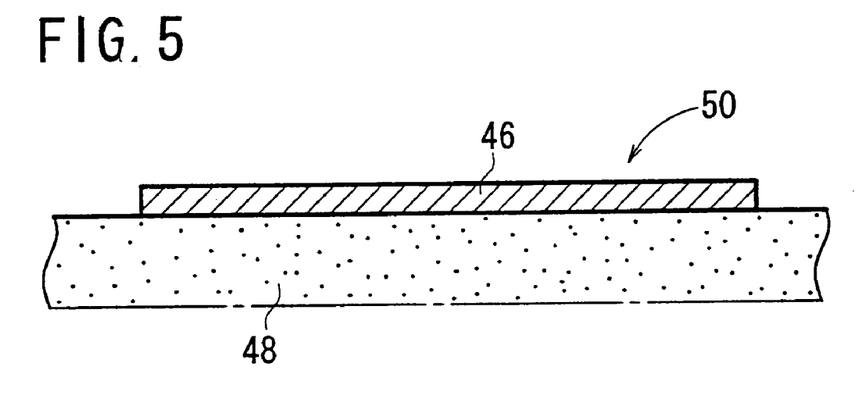
FIG. 5 is a sectional view in which an electrode pattern of a conductor paste is formed on a dielectric layer.

Specifically, in this embodiment, a material 44 is firstly prepared, in which surfaces of Ag powder particles 40 are coated with alumina 42 as shown in FIG. 4. After that, as shown in FIG. 5, the conductor paste 46 is prepared from the material 44. Subsequently, the conductor paste 46 is printed on a dielectric layer 48 by means of the screen printing, for example. In other words, an electrode pattern 50 of the conductor paste 46 is formed on the dielectric layer 48.

In this case, the BET specific surface area of the Ag powder particle 40 is preferably 0.05 to 2 m²/g, for the following reason. If the BET specific surface area is less than 0.05 m²/g, the Ag powder particle 40 may become too large and pores may be formed in the electrode during the sintering. If the BET specific surface area of the Ag powder particle 40 is larger than 2 m²/g, it is necessary to increase the coating amount of alumina 42 in order to avoid the structural defects in the electronic component. In this case, when the electrode pattern 50 is formed and the stacked type dielectric filter 10 is produced, the electric resistance of the electrode pattern 50 may be increased and the electric characteristics and the device characteristics may be deteriorated. Therefore, it is preferable that the BET specific surface area of the Ag powder particle 40 is 0.05 to 2 m²/g.

It is preferable that the Ag powder particle 40 is coated with the alumina 42 in an amount of approximately 0.01 to 2% as converted into a value of oxide with respect to the Ag powder particle 40.

Figure 6:
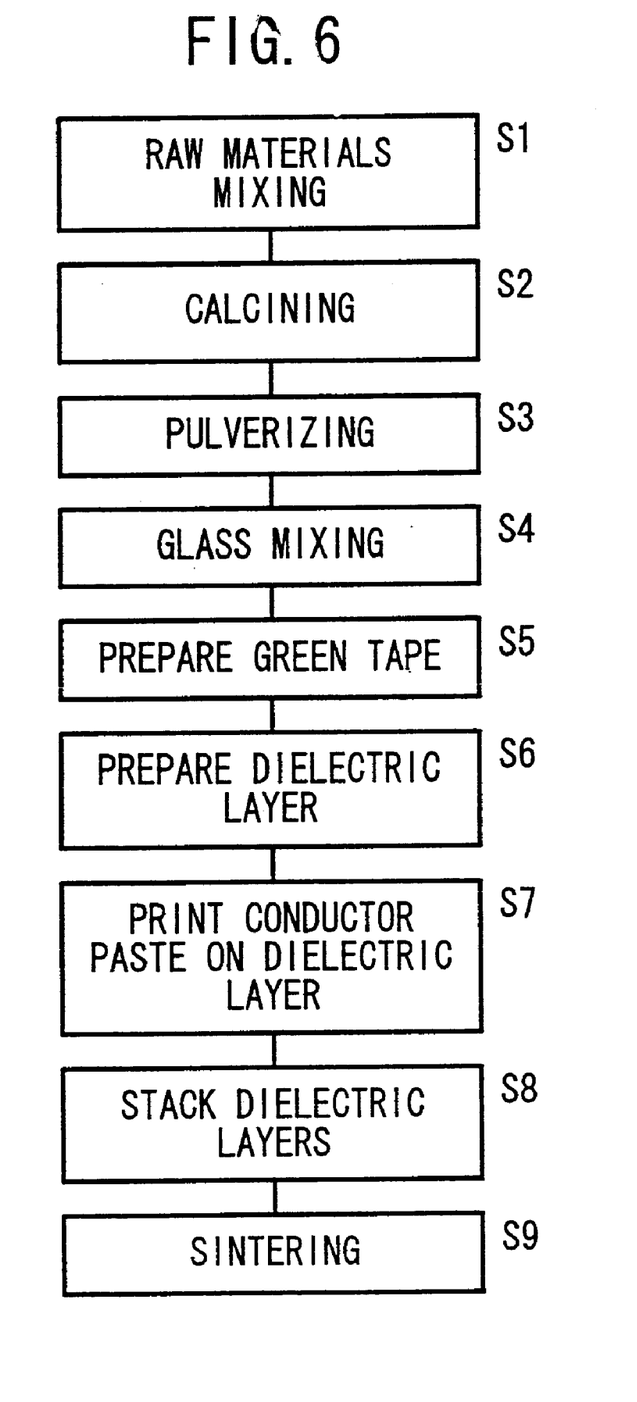
FIG. 6 shows a block diagram illustrating steps of a method for producing the stacked type dielectric filter in the embodiment according to the present invention.

A method for producing the stacked type dielectric filter 10 in the embodiment according to the present invention will now be explained with reference to a flow chart shown in FIG. 6.

At first, in step S1, raw materials to prepare the dielectric layer 48 are mixed. For example, when a conductor such as Ag and Cu is used as a constitutive material for the electrode, it is difficult to co-fire such a material with ordinary dielectric materials. Therefore, dielectric materials which can be sintered at a temperature lower than the melting point (not more than 1100° C.) of such a conductor are used.

When the electronic component is used as a microwave filter, it is desirable that the temperature characteristic (temperature coefficient) of the resonance frequency of a parallel resonance circuit to be formed is not more than ±50 ppm/° C. in view of the character of the device. Therefore, in the embodiment of the present invention, the dielectric materials which satisfy the condition as described above are used.

For example, such dielectric materials include:

(1) glass-based materials such as a mixture of cordierite-based glass powder, $TiO_2$ powder, and $Nd_2Ti_2O_7$ powder;

(2) materials obtained by adding a slight amount of glass-forming component and/or glass powder to a composition based on $BaO—TiO_2—Re_2O_3—Bi_2O_3$ (Re: rare earth component); and (3) materials obtained by adding a slight amount of glass powder to a dielectric magnetic composition powder based on barium oxide-titanium oxide-neodymium oxide.

In the embodiment of the present invention, for example, the raw material is prepared by mixing 19.0% by weight of BaO powder, 37.0% by weight of $TiO_2$ powder, 36.0% by weight of $Nd_2O_3$ powder, and 8.0% by weight of $Bi_2O_3$ powder.

After that, in step S2, the raw material is calcined, for example, at 1250° C. Subsequently, in step S3, the calcined raw material is pulverized. Thereafter, in step S4, the raw material powder after the pulverization is mixed with borosilicate glass, for example. Further, in step S5, a green tape is prepared. In the embodiment of the present invention, the raw material mixed with the glass is added to a butyral organic binder, a plasticizer, a toluene solvent, and an alcohol solvent, then sufficiently mixed with alumina balls to form a slurry. The slurry is used to prepare the green tape having a thickness of 0.2 mm to 0.5 mm by means of the doctor blade method.

Subsequently, in step S6, a large number of dielectric layers 48 are formed from the green tape. After that, in step S7, the conductor paste 46 is printed on the dielectric layer 48 on which the electrode is to be formed by means of the screen printing, for example. Accordingly, the electrode pattern 50 is formed of the conductor paste 46. The conductor paste 46 contains the material 44 made by coating the surfaces of the Ag powder particles 40 with alumina 42 as described above.

After that, in step S8, the dielectric layers 48 formed with the electrode patterns 50 and the other dielectric layers 48 are stacked to prepare a stack of the dielectric layers 48. Subsequently, in step S9, the stack is sintered, for example, at 900° C.

When the sintering of step S9 comes to the end, the stacked type dielectric filter 10 in the embodiment according to the present invention is completed. The stacked type dielectric filter 10 comprises at least the resonance electrodes 16A to 16C which are formed in the dielectric substrate 12 of the plurality of dielectric layers 48.

As described above, in the embodiment of the present invention, the resonance electrodes 16A to 16C are formed by using the conductor paste 46 including the material 44 in which the Ag powder particles 40 are coated with alumina 42.

Usually, when the resonance electrodes 16A to 16C are formed of metal films, the shrinkage of the metal film is advanced faster than the shrinkage of the dielectric layer 48 during the sintering which will be performed later. The reason for this is that the behavior of shrinkage of the metal film is greatly different from that of the dielectric layer 48.

Therefore, the following phenomena may take place:

(a) Delamination is generated at a portion where the metal film has been formed; and (b) Residual stress is generated in the dielectric layer 48 after the sintering. As a result, some structural defects may occur in the electronic component.

However, in the embodiment of the present invention, the electrode pattern 50 is formed by using the conductor paste 46 containing the material 44 in which the Ag powder particles 40 are coated with alumina 42. Accordingly, the behavior of shrinkage of the electrode pattern 50 is close to the behavior of shrinkage of the dielectric layer 48 because of the coating with alumina 42. Therefore the following phenomena will not take place:

(a) Generation of the delamination during the sintering; and (b) Generation of the crack due to the residual stress.

That is, in the embodiment of the present invention, when at least the resonance electrodes 16A to 16C are formed in the dielectric substrate 12, it is possible to effectively reduce the occurrence of the structural defects during the sintering of the dielectric substrate 12.

An exemplary experiment will now be described. In this exemplary experiment, two hundred samples were prepared in each of lots. The reliability test was performed for each of the lots while changing the BET specific surface area of the Ag powder particle 40, the coating amount of alumina 42, and the printing thickness. The base materials for the dielectric layer 48 were different between the samples having lot numbers 1 to 13 and the samples having lot numbers 14 to 20. The base materials of the samples had the same composition, but particle diameters after pulverization were different. The particle diameter of the base material for the samples having lot numbers 1 to 13 was larger than the particle diameter of the base material for the samples having lot numbers 14 to 20.

The reliability test was performed in accordance with the following specified procedure. It was confirmed whether or not any crack (for example, fissure or hollow space) appeared in sample lots under the three conditions, i.e., (1) after the sintering, (2) in the heat shock test, and (3) in the static humidity test. The samples having any crack were counted. The crack was confirmed by using a scanning acoustic microscope.

In the heat shock test, the occurrence of crack was examined when thirty-three cycles were repeatedly performed provided that one cycle included the temperature change starting from the low temperature (−40° C.) via the high temperature (85° C.) to the low temperature (−40° C.) again.

In the static humidity test, the occurrence of crack was examined when the samples were exposed for 240 hours to an atmosphere in which the temperature was 70° C. and the humidity was 90 to 95%. Especially, in the static humidity test, the occurrence of crack was examined at intermediate laps (in 48 hours and 120 hours).

Figure 7:
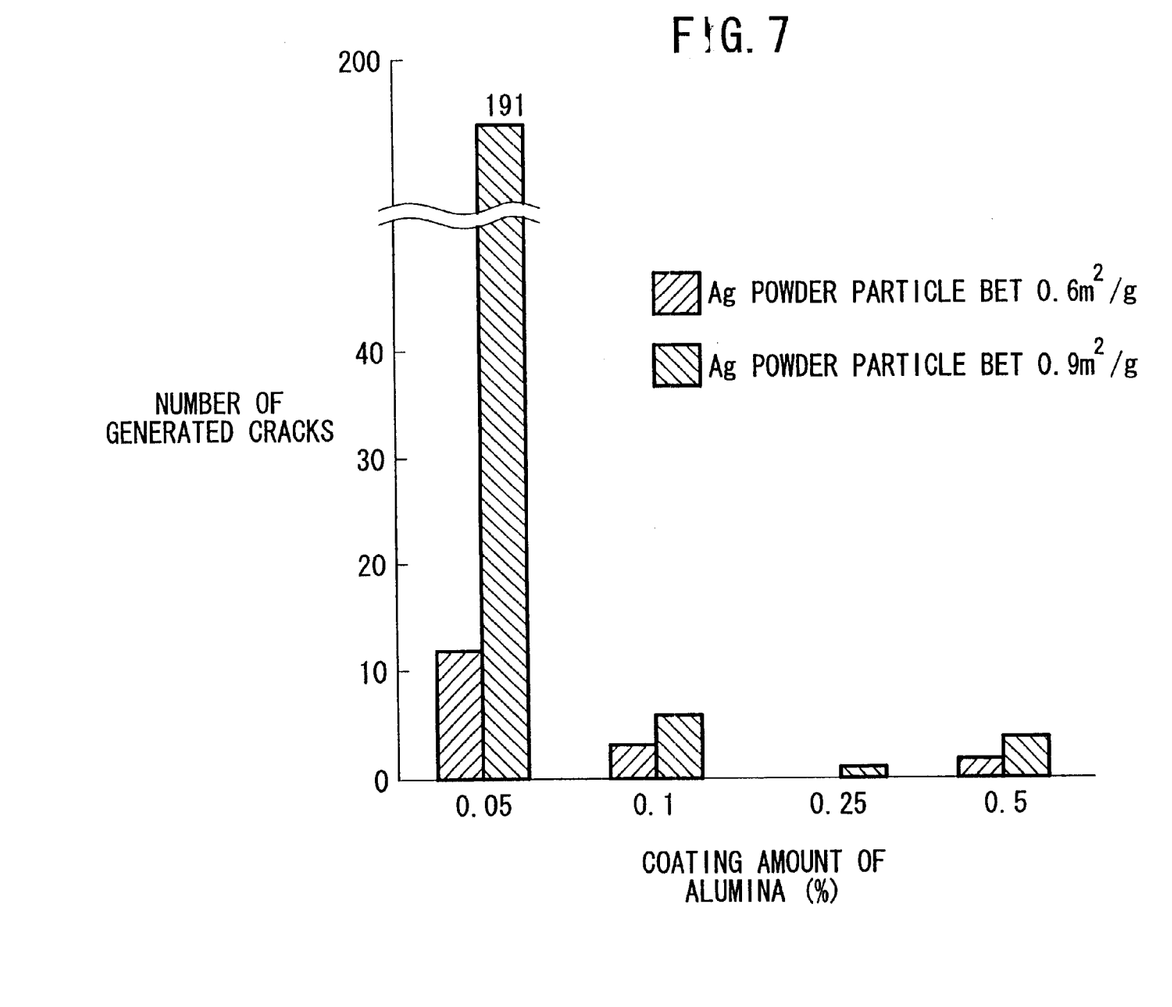
FIG. 7 shows the difference in number of generated cracks with respect to the coating amount of alumina and the BET specific surface area of Ag powder particles for a base material of lot numbers 1 to 13.
Figure 8:
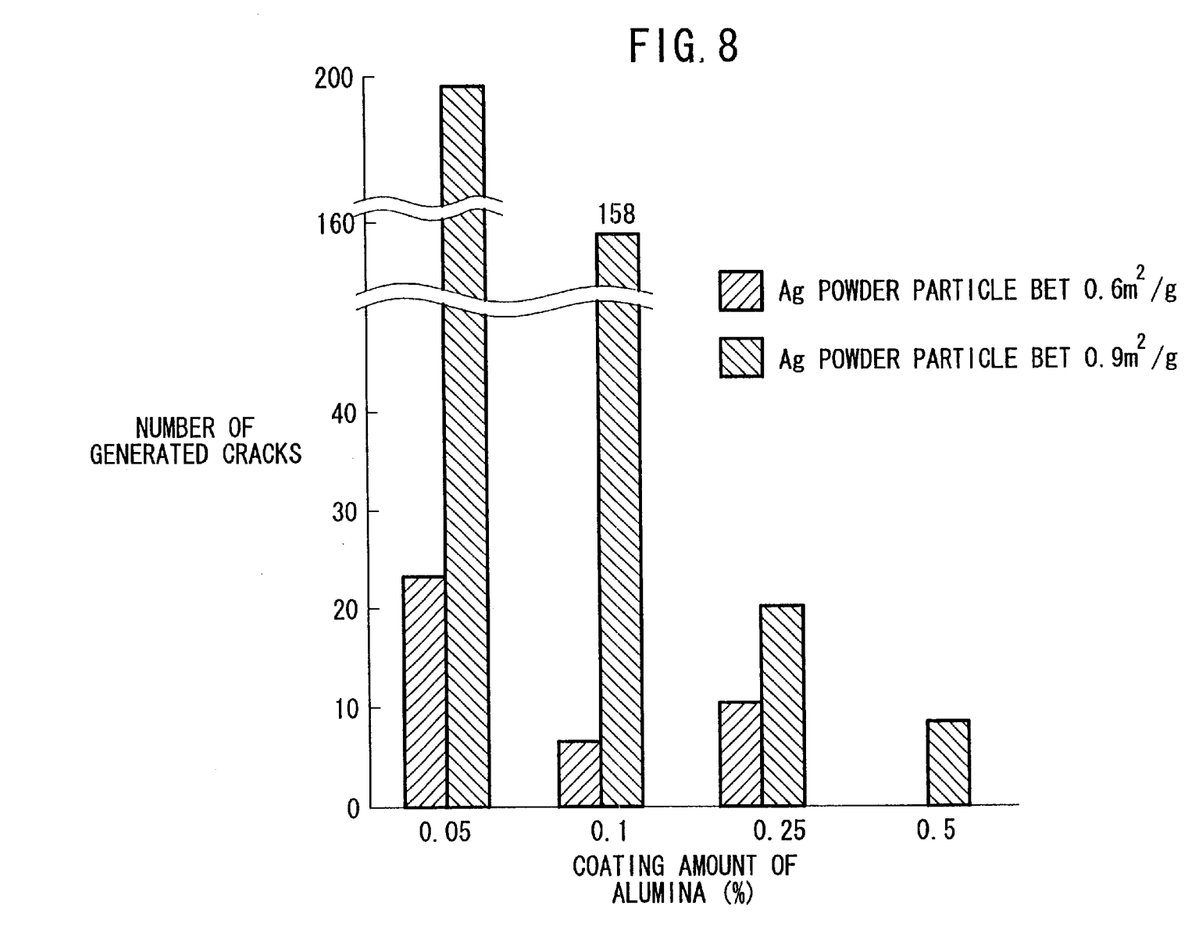
FIG. 8 shows the difference in number of generated cracks with respect to the coating amount of alumina and the BET specific surface area of Ag powder particles for a base material of lot numbers 14 to 20.

Results of the exemplary experiment are shown in FIGS. 7 and 8. FIG. 7 shows the difference in number of generated cracks with respect to the coating amount of alumina 42 and the BET specific surface area of the Ag powder particles 40 for the base material of the lot numbers 1 to 13. FIG. 8 shows the difference in number of generated cracks with respect to the coating amount of alumina 42 and the BET specific surface area of the Ag powder particles 40 for the base material of the lot numbers 14 to 20.

According to the results shown in FIGS. 7 and 8, it is realized that the number of generated cracks is large when the BET specific surface area of the Ag powder particle 40 is 0.9 $m^2/g$ as compared with those in which BET specific surface area of the Ag powder particle 40 is 0.6 $m^2/g$. The number of generated cracks is also large for samples in which the coating amount of alumina 42 is small.

According to the exemplary experiment, it is understood that the number of generated cracks can be greatly reduced by adjusting the BET specific surface area of the Ag powder particle 40 and the coating amount of alumina 42.

It is a matter of course that the electronic component and the method for producing the same according to the present invention are not limited to the embodiment described above, which may be embodied in other various forms without deviating from the gist or essential characteristics of the present invention.

What is claimed is:

1. An electronic component comprising:
   a dielectric substrate formed by stacking a plurality of dielectric layers and sintering said plurality of stacked dielectric layers; and
   one or more electrodes formed of a paste, said paste containing metal powder particles, each of said metal powder particles coated with inorganic oxide.

2. The electronic component according to claim 1, wherein each of said metal powder particles is Ag.

3. The electronic component according to claim 1, wherein a BET specific surface area of said metal powder particles is 0.05 to 2 $m^2/g$.

4. The electronic component according to claim 1, wherein said inorganic oxide is alumina.

5. The electronic component according to claim 1, wherein each of said metal powder particles is coated with said inorganic oxide in an amount of approximately 0.01 to 2% as converted into a value of oxide with respect to each of said metal powder particles.

6. A method for producing an electronic component, comprising the steps of:
   preparing a plurality of dielectric layers;
   forming a paste on one or more of said dielectric layers; and
   stacking and sintering said plurality of dielectric layers to produce said electronic component,
   wherein said paste contains metal powder particles, and each of said metal powder particles is coated with inorganic oxide.

* * * * *

UNITED STATES PATENT AND TRADEMARK OFFICE
CERTIFICATE OF CORRECTION

PATENT NO. : 6,556,419 B2
DATED : April 29, 2003
INVENTOR(S) : Hideyuki Suzuki and Masahiro Abe It is certified that error appears in the above-identified patent and that said Letters Patent is hereby corrected as shown below:

<u>Title page,</u>
Item [57], ABSTRACT, please delete the ABSTRACT in its entirety and replace with the following rewritten abstract:
-- Ag powder particles, each having a surface coated with alumina, form a material from which a conductor paste is prepared. The conductor paste is printed on a dielectric layer by means of screen printing, for example. Accordingly, an electrode pattern of the conductor paste is formed. In this procedure, the BET specific surface area of the Ag powder particles is 0.05 to 2 $m^2/g$. The coating amount of alumina is about 0.01 to 2% as converted into a value of oxide with respect to the Ag powder particles. --

<u>Column 3,</u>
Line 57, "DESCRIPTION OF THE PREFERRED EMBODIMENTS" should read
-- DETAILED DESCRIPTION OF THE INVENTION --

Signed and Sealed this

Twelfth Day of August, 2003

JAMES E. ROGAN
*Director of the United States Patent and Trademark Office*